United States Patent [19]

Henley

[11] Patent Number: 5,170,127
[45] Date of Patent: Dec. 8, 1992

[54] CAPACITANCE IMAGING SYSTEM USING ELECTRO-OPTICS

[75] Inventor: Francois J. Henley, Los Gatos, Calif.

[73] Assignee: Photon Dynamics, Inc., Milpitas, Calif.

[21] Appl. No.: 658,132

[22] Filed: Feb. 19, 1991

[51] Int. Cl.$^5$ .................... G01R 27/26; G01R 31/28; G01J 4/00

[52] U.S. Cl. .................... 324/658; 324/96; 324/158 R; 324/73.1; 359/246; 356/364

[58] Field of Search ............. 324/658, 663, 686, 690, 324/158 R, 96, 73.1, 158 F; 359/245-247, 276, 277; 356/364, 367, 368, 388

[56] References Cited

U.S. PATENT DOCUMENTS

| | | |
|---|---|---|
| 4,523,847 | 6/1985 | Bjorklund et al. . |
| 4,618,819 | 10/1986 | Mourou et al. . |
| 4,758,092 | 7/1988 | Heinrich et al. . |
| 4,855,591 | 8/1989 | Nakamura et al. . |
| 4,862,075 | 8/1989 | Choi . |
| 4,868,492 | 9/1987 | Beha et al. .................. 324/158 R X |
| 4,875,006 | 10/1989 | Henley et al. . |
| 4,906,922 | 3/1990 | Takahashi et al. . |
| 4,910,458 | 3/1990 | Forsyth et al. . |
| 4,983,911 | 1/1991 | Henley . |
| 4,999,577 | 3/1991 | Beha et al. ...................... 324/158 R |
| 5,025,209 | 6/1991 | Takanashi et al. .................... 324/96 |

Primary Examiner—Jack B. Harvey
Attorney, Agent, or Firm—Townsend and Townsend

[57] ABSTRACT

An unassembled simple matrix liquid crystal display (LCD) panel, with strips of highly-conductive material, is tested by extracting a two-dimensional image of the capacitance distribution across the surface of the panel under test (PUT) through illumination of a modulator placed adjacent the surface, such as an NCAP modulator or other liquid dispersed polymer-based device. The light modulator is disposed to allow longitudinal probing geometries such that a measurement of capacitance is developed across a gap between the surface of the panel under test and the opposing face of the modulator which causes a power modulation in the optical energy which can be observed through an area optical sensor (such as a camera) for use in directly produce a two-dimensional spatially-dependent power modulation image directly representative of the spatially corresponding capacitance state on the surface of the panel under test.

15 Claims, 2 Drawing Sheets

CAPACITANCE IMAGING SYSTEM USING ELECTRO-OPTICS

CROSS REFERENCE TO RELATED APPLICATIONS

This application is related to applications filed in the name of the present inventor under the title VOLTAGE IMAGING SYSTEM USING ELECTRO-OPTICS, including a continuation-in-part application filed Feb. 13, 1991, Ser. No. 654,709, which is co-pending with U.S. Pat. application Ser. No. 07/582,577, filed Sep. 13, 1990, which in turn is a continuation-in-part of U.S. Pat. application Ser. No. 07/481,429 filed Feb. 15, 1990, now U.S. Pat. No. 4,983,911, issued Jan. 8, 1991. The content of the applications is incorporated herein by reference and made a part hereof. The present invention departs from the voltage imaging systems in that the prior inventions were capable of diagnosing structures wherein there was no differences in capacitance across the structure under test.

All of the above-mentioned related applications are directed to imaging systems useful primarily to produce images of voltage distribution in individual conductive elements, such as the pixel locations of active matrix LCD displays. The latest-filed application is directed to a voltage imaging system with separate bias and excitation sources. The second-filed application is related to a voltage imaging system using nonpolarized imaging. The first filed application is related to a voltage imaging system using polarized imaging.

BACKGROUND OF THE INVENTION

This invention relates to electro-optic sensing of capacitance, and more particularly, to electro-optic sensing of capacitance as a function of position of a large plurality of conductance regions on a surface.

There is a special and growing need to be able to test and extract conductance information from an unfinished surface intended to produce electronic signals, including circuit boards, multi-chip modules and liquid crystal display (LCD) panel components. In particular, the invention is useful for diagnosing the open/short integrity of the unassembled panel structure of a simple matrix liquid crystal display (LCD) panel (also known as a direct multiplex LCD panel). The present contact-type electronic test systems have a technology capable of testing circuit boards or panels (a panel under test or PUT) having a node density not exceeding approximately 100 nodes per square inch.

Liquid crystal display panels, particularly the simple matrix LCD panels, have multiple layers of closely-spaced strips of conductive transparent indium tin oxide (ITO) associated with a polarizing layer. In a high density panel, spacing of 90 μm-wide strips on one substrate may be separated by as little as about 20 μm, with second strips on an opposing substrate opposing the first substrate disposed to run transverse (in the x-direction) to the first strips (oriented in the y-direction) of the first substrate. The space to be filled with liquid crystal material between the crossover of the first strips and the second strips define the pixel points. (The completed structure may also include light polarizing layers and reflective layers or backlight modules.) A time multiplexed signal applied to the x-direction strips and to the y-direction strips produce a change in polarization of liquid crystal material in the space between the crossover of two excited transverse strips. Because of the high density and close spacing, contact testing is very difficult. Such panels also may have an additional insulating layer covering the deposited structure, rendering it impossible to place contact probes at selected positions on the panel. It is therefore impractical to impose contact testing on such panels. Nevertheless, current and projected production methods and strategies demand that each pixel of such a panel be tested for its ability to change polarization state. The current state of the art does not provide a test technique for such structures.

Direct optical inspection of LCD panels is exceedingly difficult, since the ITO strips are not only extremely thin and closely-spaced, the ITO is purposely transparent at visible wavelengths. In addition, ITO is subject to microscopic cracking which is extremely difficult to detect by direct optical inspection, even if the ITO were not transparent. Bridges or shorts between adjacent strips are also difficult to detect optically because of the close spacing. Moreover, it is difficult to detect shorts by direct electrical continuity measurement early in the manufacturing stage, since the parallel strips are typically manufactured with a common electrical connection along at least one end of the strips. Hence, it is difficult using conventional continuity testing to detect for shorts between adjacent strips.

It is known to use electro-optic devices for serially testing selected nodes of a voltage producing device. Reference is made to U.S. Pat. Nos. 4,875,006 and 4,862,075. The subject matter of those patents is incorporated herein and made a part hereof. Therein, the use of a single light beam is described to serially access individual sensor nodes using a unique sensor/laser arrangement giving control over a beam of light whereby a Pockels Cell Modulator employs the electro-optic Pockels effect to sense local electric fields produced by voltage on a surface. Such known devices require control of a beam by scanning technology such as an acoustic-optic deflector or an x-y stage. Known systems are thus limited to single beam, serial data extraction.

The voltage imaging systems described in the related applications and issued patent, namely in U.S. Pat. No. 4,983,911, describe techniques applicable primarily to voltage imaging of active matrix LCD panels. Voltage imaging is not directly applicable to all types of simple matrix LCD testing problems, although the present invention and the voltage imaging techniques share certain configurations and some of the components. In the voltage imaging techniques, in order to apply voltage imaging techniques, the bias point in the voltage-light transfer function of an NCAP (nematic curvilinear aligned phase) modulator is chosen to place operation of the NCAP modulator in a quasi-linear transition region. As a consequence the signal-to-noise ratio is limited by the slope of the gain curve. It is desirable to improve over the voltage imaging techniques described in the '911 patent.

There is no known art capable of producing an image reproduction of a large area using capacitance detected by means of an electro-optic imaging device.

SUMMARY OF THE INVENTION

According to the invention, an unassembled simple matrix liquid crystal display (LCD) panel, with strips of highly-conductive material, is tested by extracting a two-dimensional image of the capacitance distribution across the surface of the panel under test (PUT) through illumination of a modulator placed adjacent the surface, such as an NCAP modulator or other liquid dispersed polymer-based devices. The light modulator is disposed to allow longitudinal probing geometries such that a measurement of capacitance is developed across a gap between the surface of the panel under test and the opposing face of the modulator which causes a power modulation in the optical energy which can be observed through an area optical sensor (such as a camera) for use to directly produce a two-dimensional spatially-dependent power modulation image directly representative of the spatially corresponding capacitance state on the surface of the panel under test. Light power is observed upon two-pass reflection through the electro-optic light modulator. A camera or other imaging sensor can be used as an instrument to detect the spatial image.

An apparatus operating in accordance with the method of the invention includes an optical energy source, such as a laser, an electro-optic sensor (light modulator) exhibiting an electro-optic effect, such as the light scattering effect present in NCAP (nematic curvilinear aligned phase) or PDLC (polymer dispersed liquid crystal) films, when placed in close proximity to the panel under test, and means for spatially observing a spatially-modulated light beam.

The invention has particular application to noninvasive testing of high-density simple matrix liquid crystal display (LCD) panels wherein the conductors thereof are highly conductive as compared to surrounding areas. Other applications of comparable environment are considered within the scope of the invention.

The invention will be better understood by reference to the following detailed description in connection with the accompanying drawings.

DESCRIPTION OF SPECIFIC EMBODIMENTS

Figure 1:
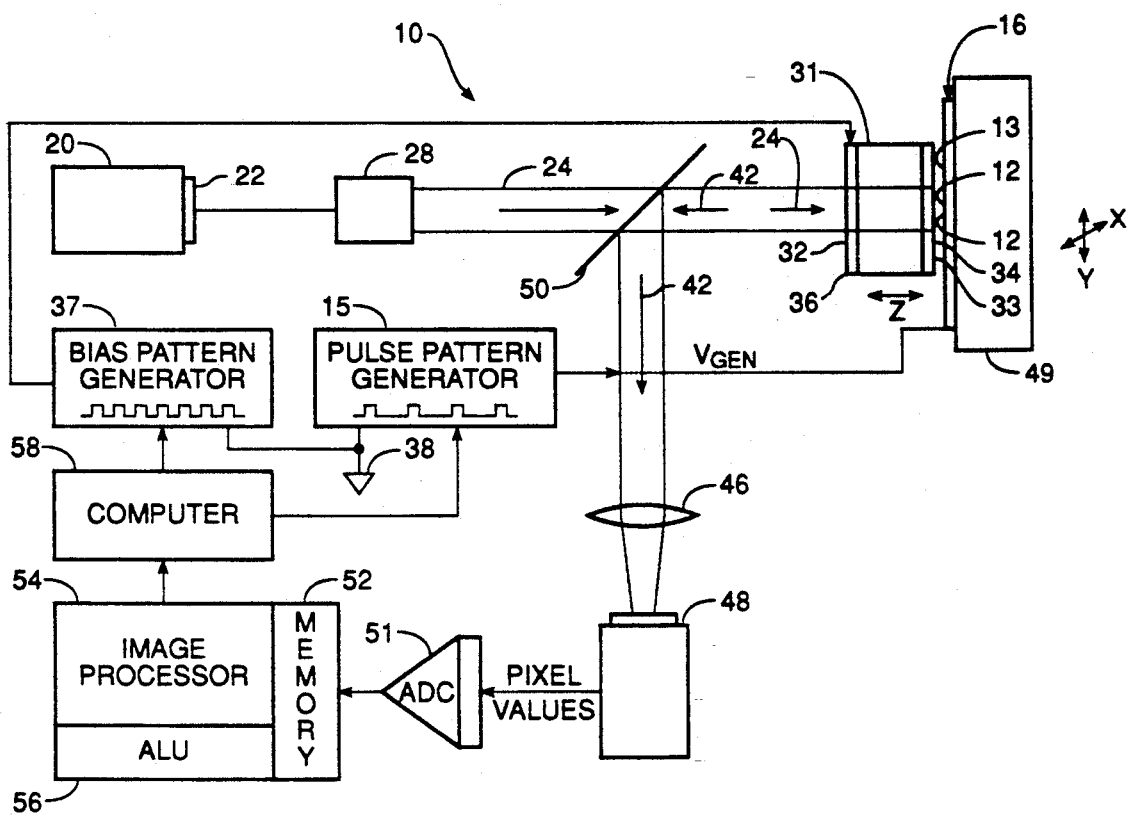
FIG. 1 is a block diagram of a first embodiment of the invention.
Figure 2:
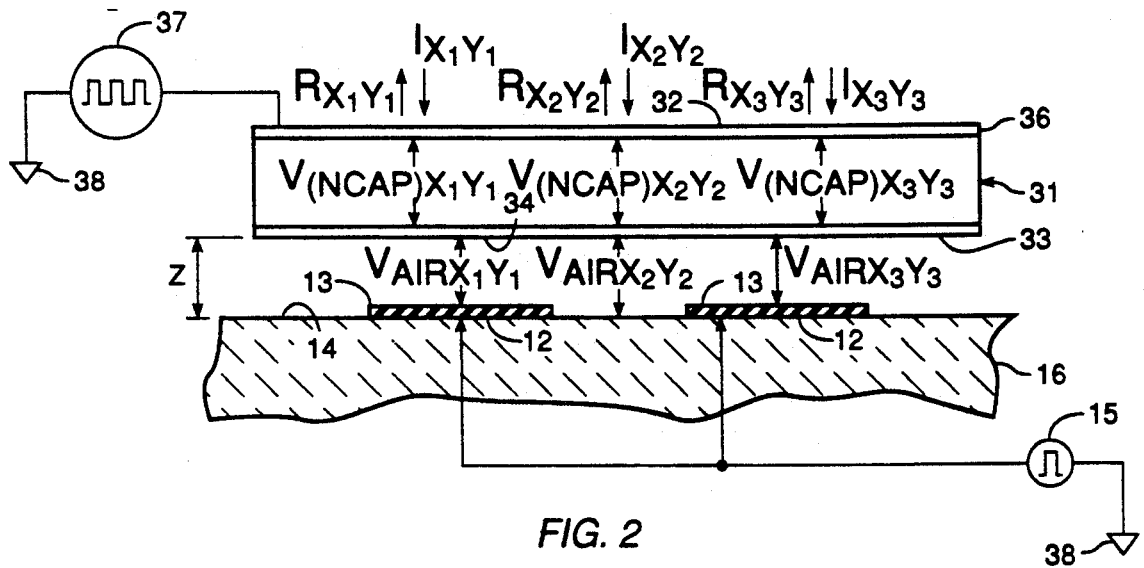
FIG. 2 is a side cross-sectional view of an electro-optic crystal adjacent a simple matrix panel under test in accordance with the invention.

FIG. 1 illustrates an embodiment of a capacitance imaging system 10 for observing voltage at a large plurality of positions 12 on strips 13 on a surface 14 of a plate 16 or panel under test (PUT) forming a portion of a simple matrix LCD panel. FIG. 2 illustrates a detail of a portion of the system 10. A key element is an optical modulator 31, the light transmissivity of which is controlled by the differential in voltage at each location between a first face 32 and a second face 34.

The PUT 16 is a panel of glass upon which are strips 13 of highly-conductive, optically-transparent material such as indium tin oxide (ITO), which may be only a few hundred to a few thousand Angstroms thick, nominally separated on the glass surface by as little as about 20 μm. The strips 13 of the PUT 16 may be connected to a source of input voltage, in particular a pulse generator 15 referenced to a common 38 in order to produce voltages at selected times and at selected sites on the surface of the PUT 16 opposing the modulator 31.

In order to probe the voltage, there is first a source 20 of optical energy, such as a xenon, sodium, or quartz halogen lamp, a pulsed or continuous LED, laser or the like. The source optical energy is channeled into a source beam 22 and processed to produce an optical input beam 24 which may expanded and collimated with a beam expander 28. For this purpose, there may be provided a lens, mirror or fiber optic system 28 to expand and collimate the source beam into the input beam 24. The collimated input beam 24 preferably has a constant or at least known power density cross-section.

The input beam 24 is directed into electro-optic modulator means 31 of a specific type, structure and possibly atomic or molecular axis orientation. A suitable modulator 31 may be a modulator fabricated of an NCAP or PDLC material in the for of a film. This power modulator means 31 utilizes the light scattering properties of liquid crystal droplets encapsulated in a polymer matrix. The encapsulation structure produces a curvilinear alignment of the liquid crystal molecules, and this aligned phase can be optically switched by a controlled electric field as desired between opposing faces 32 and 34. The device is therefore switchable from a highly light scattering state to a highly transmissive state.

Choice of the point of bias and choice of the voltage excursion across the modulator means 31 are important factors affecting the operation of modulator means 31 as a mechanism for sensing capacitance and thereby conductivity at a position 12 on the PUT 16. The electro-optic modulator means 31 with its first face 32 and opposing second face 34 allows longitudinal probing geometries. The first face 32 has a conductive coating 36 which is transparent, such as indium tin oxide (ITO), and which is electrically coupled through a bias pattern generator 37 to a voltage common 38, such as ground. The bias pattern generator 37 preferably provides a pulsed voltage pattern to establish an rms voltage differential relative to a testing voltage, as applied to the PUT 16, as hereinafter explained. The second face 34 of modulator means 31 (FIG. 1 and FIG. 2) has a highly-reflective nonconductive coating 33, which produces a retro-reflection of the input beam 24 at each point 12, as represented by incident rays $I_{x1y1}$, $I_{x2y2}$, $I_{x3y3}$ and corresponding reflected rays $R_{x1y1}$, $R_{x2y2}$, $R_{x3y3}$. The reflective coating 33 may be a dielectric coating or stack of dielectric material. The second face 34 is disposed adjacent the surface 14 of the PUT 16 as separated by an air gap Z, which is held to about 10 μm.

A circuit is formed at each point on the surface 14 of the PUT 16 which is useful for measuring relative capacitance at each of those points without surface contact. The circuit is formed by the series connection of bias generator 37 $V_{bias}$ with the voltage drop across the modulator 31 $V_{(NCAP)}$ at each position ($X_1$, $Y_1$; $X_2$, $Y_2$; $X_3$, $Y_3$), the voltage drop across the air gap $V_{air}$ at each position ($X_1$, $Y_1$; $X_2$, $Y_2$; $X_3$, $Y_3$), and the pulsed excitation voltage source 15 $V_{gen}$, which is coupled to a common 38 with the bias generator 37. The voltage at each position $X_i$, $Y_i$ across the modulator means 31 is thus given by:

$$V_{(NCAP)} = (|V_{bias} - V_{gen}|)*(C_{air})/(C_{NCAP} + C_{air}),$$

where:

$C_{air}$ is an effective capacitance per unit area, which is the series capacitance of the air gap capacitance with the surface capacitance of the underlying region of the panel under test, which may be very small for a nonconductive region or very large for an electrically-connected conductive region, and $C_{NCAP}$ is the capacitance per unit area of the modulator means 31.

Figure 4:
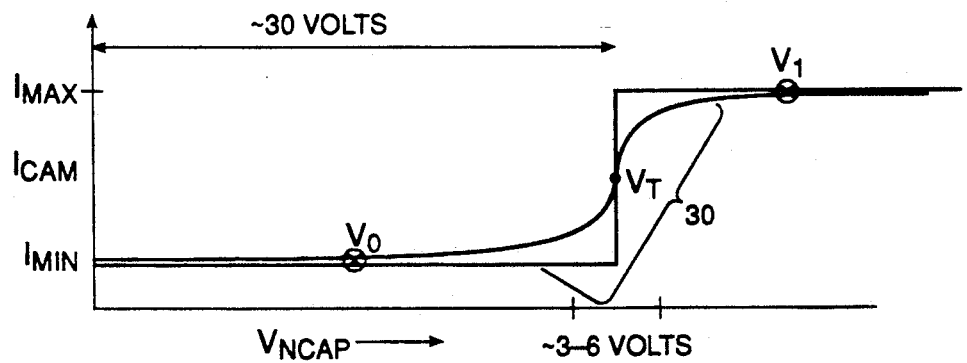
FIG. 4 is a graph of a voltage/light transfer function for an NCAP modulator.
Figure 3A:
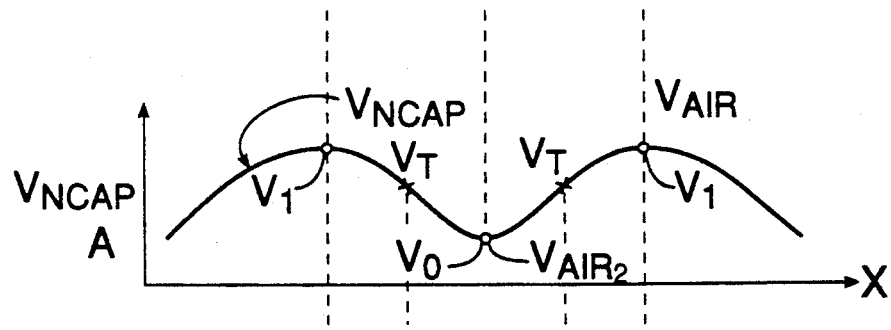
FIG. 3 illustrates a voltage profile of a modulator in connection with a transmissivity profile corresponding to the voltage profile.
Figure 3B:
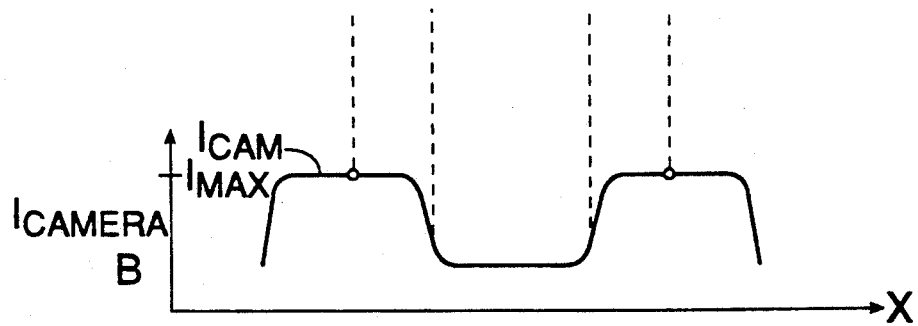

As an example, if an electrically-connected conductive layer, such as a connection to a shorting bar, the effective capacitance is the air gap capacitance at that point. Similarly, where there is an underlying ground plane, the effective capacitance is the air gap capacitance in series with the capacitance of the medium above the ground plane. In contrast, if there is no electrical connection or no conductive material, the effective capacitance is so small as to approach zero. The image is a measurement of the capacitance distribution of the panel under test. If there is a region of floating conductors, it will be exhibited as a region of lower capacitance.

Where the measurable capacitance of the air goes to zero, i.e., where there is no opposing adjacent conductive strip, the voltage across the modulator drops sharply. FIG. 3, in plot A, illustrates such a voltage profile for a longitudinal probing geometry of a modulator 31, together with a transmissivity profile in plot B, aligned with the positions of strips 13 in FIG. 2. Most of the light through the modulator 31 is scattered when the voltage across the structure is low, as indicated in plot B. Referring to FIG. 4 in connection with FIG. 2 and FIG. 3, there is shown a voltage/light transfer function. Maximum light scattering (minimum transmissivity) occurs where voltage is low, as at $V_0$. Minimum light scattering (maximum transmissivity) through the modulator 31 occurs where the voltage is high, as at $V_1$. A threshold voltage $V_T$ of typically about 30 volts is in a quasi-linear region in a nonlinear light/voltage transfer characteristic. The quasi-linear regions is a segment of about 3-6 volts about point $V_T$. This is the region utilized by a voltage imaging system, wherein small voltage excursions are applied with calibration of the voltage to the transmissivity. Beyond the extremes of the quasi-linear region 30, however, the transmissivity $I_{CAM}$ as viewed by a camera varies from about 5% to about 80% of the incident light. This light range can only be achieved if the voltage excursions are large, i.e., larger than excursions limited to the quasi-linear region 30. Such large voltage excursions are exhibited if there is a differential in capacitance between points.

According to the present invention, large voltage excursions, as a result of the presence and absence of a voltage-carrying conductive structure on the panel 16, are used to excite the modulator 31. There is no particular need to calibrate the voltage transfer function in the quasi-linear region 30 around $V_T$, since there is no nearby conductive region in the panel 16. Further according to the invention, the rms bias voltage across the modulator 31 at a point $X_i$, $Y_i$ of maximum known conductivity is selected to fall in the region of maximum transmissivity, for example, at voltage $V_1$. The bias voltage is supplied by the bias generator 37 as a repetitive pattern, such as a pulse width modulated voltage, with an rms value selected to at least just exceed the quasi-linear region 30. As a consequence, the transmissivity characteristic $I_{CAM}$ as seen by a camera exhibits sharp differences among points 12 ($X_1Y_1$; $X_3$, $Y_3$) on the face 14 in conductive contact with a voltage generator 15 and regions $X_2,Y_2$ of no direct conductive connection. Because capacitance differences are detected, the nonlinearity of the transfer function of the modulator material can be employed to increase the contrast of the two-dimensional image produced by illumination of the modulator material. By comparison, voltage imaging is limited to operation in the quasi-linear region.

The separation between the second face 34 and the surface 14 is controlled, preferably being as close as practical without causing side effects, such as shorts, thermal transfer or mechanical distortion due to stress. The selection of the spacing is made to maximize the ratio of signal to noise, particularly noise attributable to cross-talk from electric fields produced by adjacent points of voltage. A working rule is to place the second face 34 of the modulator relative to the surface 14 at less than the distance between positions 12 and preferably no more than 30% of the diameter of the pixel area. The separation may be controlled by a mechanical positioner, such as a movable table arrangement 49.

In order to extract the information, means are provided for detecting the change in transmissivity in the image across the output beam 42 to analyze the voltages at each excited position. Referring to FIGS. 1 and 2, the detectors may comprise means such as a sensitive camera 48 receiving light through for example a focussing lens 46. The output beam 42 is separated from the collinear input beam 24 by means of a beam splitter 50. As a still further alternative, the input beam and the output beam can be separated by orienting the reflective surface 33 of the phase modulator 31 so that it is not perpendicular to the incident radiation. The output beam 42 is thus separated upon reflection, and a beam splitter is not needed.

The beam splitter 50 intercepts the spatially-dependent power modulation, producing, as seen by the camera, an observable map in two dimensions having features corresponding to conductance on the panel under test 16. For example, a short between adjacent strips 13 will be immediately apparent as a bridge in the viewfinder of a camera 48. Opens in any strip 13 will also be immediately apparent as a transition between a strip of maximum transmissivity and a region of minimum transmissivity. Moreover, such region will appear as maximally dark because of combined capacitance of the air gap and the substrate in the region.

There are two potentially-variable voltage sources, both synchronized so the optical sensor views only an image as a result of a differential voltage through the electro-optic modulator 31. The beam exiting the modulator 31, which in this example has made two passes through the modulator, therefore contains spatially modulated light power which carries information regarding the voltage at each point 12 across the modulator 31. The bias pattern generator 37 applies a bias of a pulse width modulated pattern to the modulator 31. The pulse pattern generator 15, however, modulates the strips 13 on the panel under test.

Image processing can be used to enhance the image and null out offsets in the image. The pulse pattern generator 15 is particularly useful for this purpose. Through manipulation in digitized format of multiple images under different bias conditions captured by the camera 48, offsets in image contrast can be virtually cancelled. To this end, pixel values are output from the camera 48 through an analog to digital converter 51 to a memory unit 52 to accumulate a first image in a first bias state and a second image in a second bias state. An image processor 54 with a suitable arithmetic logic unit (ALU) 56 compares by subtraction the two stored images. For nonconductive regions, there will be no difference. For conductive regions, there will be a clear subtraction visible as a net change.

The invention has now been described with reference to specific embodiments. Other embodiments will be apparent to those of ordinary skill in the art. For example, multi-quantum well electro-absorption modulators may be used. It is therefore not intended that this invention be limited, except as indicated in the appended claims.

What is claimed is:

1. An apparatus for observing an image at a large plurality of positions on a surface of a panel under test, said positions being distinguishable by differences in capacitance or conductance, said apparatus comprising:
   means for producing optical energy;
   means for directing said optical energy into an input beam of any polarization state;
   an electro-optic modulator means, said electro-optic modulator means having a first face and an opposing second face in an orientation to allow longitudinal probing geometries, said first face having a conductive coating electrically coupled to a bias reference, said bias reference set to produce elevated optical transmissivity through said modulator means proportional to capacitance at points adjacent to electrically conductive regions of said panel under test, and said second face being disposed to be adjacent an area of said surface of said panel under test, said modulator means being oriented to intercept at least a portion of said input beam directed into said modulator means through said first face to impinge on said second face across a gap adjacent said area of said surface in order to cause in an output beam spatially-dependent modulation along said input beam, said modulation being evidenced as elevated transmissivity at positions of higher effective capacitance and reduced transmissivity at regions of lower effective capacitance on said surface; and
   means for detecting said modulation in an image across said output beam to analyze said surface.

2. The apparatus according to claim 1 wherein said modulator means has a light/voltage transfer characteristic with a nonlinear portion bridging a quasi-linear zone, wherein said bias reference is an rms value set to utilize said nonlinear portion of the light/voltage transfer characteristic in order to augment spatial resolution between regions of high capacitance and low capacitance.

3. The apparatus according to claim 1 wherein said second face of said electro-optic modulator means has an optically reflective coating such that said input beam and said output beam each pass through said electro-optic modulator means, further including means for separating said output beam from said input beam.

4. The apparatus according to claim 3 wherein said input beam and said output beam are collinear, and said separating means is a beam splitter.

5. The apparatus according to claim 1 wherein said modulation is power modulation and wherein said detecting means comprises:
   means for producing an observable map having features corresponding to capacitance across said gap between said modulator means and said panel under test.

6. The apparatus according to claim 5 wherein said map producing means is a camera.

7. The apparatus according to claim 1 wherein said electro-optic modulation means is a liquid crystal.

8. The apparatus according to claim 1 wherein said electro-optic modulation means is a polymer-dispersed liquid crystal.

9. An apparatus for simultaneously observing a plurality of positions on a surface of a panel under test having positions of differing capacitance, said apparatus comprising:
   a light source for producing optical energy;
   an electro-optic modulator means, said electro-optic modulator means having a first face and an opposing second face in an orientation to allow longitudinal probing geometries, said first face having a conductive coating electrically coupled to a bias reference, said bias reference set to produce elevated optical transmissivity through said modulator means at points adjacent to higher capacitance positions of said panel under test, and said second face being disposed to be across a gap adjacent an area of said surface of said panel under test, said modulator means being oriented to intercept at least a portion of said input beam directed into said modulator means through said first face to impinge on said second face adjacent said area of said surface in order to cause in an output beam spatially-dependent change in light power along said input beam, said change in light power being evidenced as elevated transmissivity at positions of higher effective capacitance and reduced transmissivity at positions of lower capacitance; and
   means disposed to intercept said spatially-dependent light power modulation for producing an observable map of said surface of said panel under test having contrast features corresponding to positions of conductivity and positions of nonconductivity.

10. The apparatus according to claim 9 wherein said modulator means has a light/voltage transfer characteristic with a nonlinear portion bridging a quasi-linear zone, wherein said bias reference is an rms value set to utilize said nonlinear portion of the light/voltage transfer characteristic in order to augment spatial resolution between positions of high capacitance and low capacitance.

11. The apparatus according to claim 9 wherein said second face of said electro-optic modulator means has an optically reflective coating such that said input beam and said output beam each pass through said electro-optic modulator means, further including means for separating said output beam from said input beam and wherein said separating means is a beam splitter for splitting optical energy.

12. The apparatus according to claim 9 further including means for biasing said conductive regions at a first bias level and subsequently at a second bias level;
   means for recording a first image at said first bias level and for recording a second image at a second bias level; and
   means for differentially comparing said first image and said second image to produce a third image, said third image being of enhanced contrast.

13. A method for observing capacitance of positions on a surface of a panel under test comprising:
   directing an input beam of optical energy into an electro-optic modulator means, said electro-optic modulator means having a first face and an opposing second face in an orientation to allow longitudinal probing geometries, said first face having a conductive coating electrically coupled to a bias reference, said bias reference set to produce elevated optical transmissivity through said modulator means at points adjacent to electrically-connected and conductive regions of said panel under test, and said second face being disposed to be adjacent an area of said surface of said panel under test, said electro-optic modulator means being oriented to intercept at least a portion of said input beam directed into said modulator means through said first face to said second face adjacent said area of said surface of said panel under test in order to cause in an output beam a spatially-dependent modulation along said input beam, said modulation being evidenced as elevated transmissivity at positions of higher capacitance and reduced transmissivity at regions of lower capacitance on said surface; and detecting said modulation in an image across said output beam to analyze voltage differentials on said surface.

14. The method according to claim 13 wherein said modulator means has a light/voltage transfer characteristic with a nonlinear portion bridging a quasi-linear zone, wherein said bias reference is an rms value set to utilize said nonlinear portion of the light/voltage transfer characteristic in order to augment spatial resolution between positions of high capacitance and low capacitance.

15. The method according to claim 13 wherein said modulation is power modulation and wherein said detecting step comprises:

producing from said spatially-dependent power modulation an observable map having features corresponding to capacitance between said modulation means and said panel under test.

* * * * *